United States Patent [19]
Goronkin et al.

[11] Patent Number: 5,289,014
[45] Date of Patent: Feb. 22, 1994

[54] SEMICONDUCTOR DEVICE HAVING A VERTICAL QUANTUM WELL VIA AND METHOD FOR MAKING

[75] Inventors: Herbert Goronkin, Tempe; Jun Shen, Phoenix; Saied Tehrani, Scottsdale; X. Theodore Zhu, Chandler, all of Ariz.

[73] Assignee: Motorola, Inc., Schaumburg, Ill.

[21] Appl. No.: 930,958

[22] Filed: Aug. 17, 1992

[51] Int. Cl.$^5$ .................. H01L 29/161; H01L 29/205
[52] U.S. Cl. ........................................ 257/14; 257/22; 257/24; 257/183
[58] Field of Search ...................... 257/14, 20, 22, 24, 257/27, 192, 774, 781, 12, 183

[56] References Cited

U.S. PATENT DOCUMENTS

| | | | |
|---|---|---|---|
| 4,207,122 | 6/1980 | Goodman | 257/201 |
| 4,806,993 | 2/1989 | Voisin et al. | 257/22 |
| 4,974,036 | 11/1990 | Kapon | 257/14 |
| 4,983,540 | 1/1991 | Yamaguchi et al. | 257/15 |
| 5,070,375 | 12/1991 | Sakai | 257/15 |
| 5,073,893 | 12/1991 | Kondu | 257/15 |
| 5,119,151 | 6/1992 | Onda | 257/14 |
| 5,148,242 | 9/1992 | Tsukada et al. | 257/192 |

OTHER PUBLICATIONS

Beresford et al., "Polytype Heterostructures For Electron Tunneling Devices", IEDM-89, pp. 547-550.
Ismail et al., "Patterning and Characterization of Large Area Quantum Wire Arrays", Appl. Phys. Lett. 58, #14, 8 Apr. 1991, pp. 1539-1544.

Primary Examiner—Rolf Hille
Assistant Examiner—Mahshid Saadat
Attorney, Agent, or Firm—Joe E. Barbee; Aaron Bernstein

[57] ABSTRACT

A semiconductor device having a vertical interconnect or via stacked formed by quantum well comprising a semiconductor material is provided. A first semiconductor device (11) having a current carrying region (19) is formed in a first horizontal plane. A second semiconductor device (12) having a current carrying region (29) is formed in a second horizontal plane. Each of the current carrying regions have a first quantized energy level that is substantially equal. A semiconductor via (31) couples the current carrying region (19) of the first semiconductor device (11) to the current carrying region (29) of the second device (12), wherein the semiconductor via (31) has a first quantized energy level capable of alignment with the quantized energy levels of the current carrying regions (19, 29) of the first and second semiconductor devices (11,12).

8 Claims, 2 Drawing Sheets

SEMICONDUCTOR DEVICE HAVING A VERTICAL QUANTUM WELL VIA AND METHOD FOR MAKING

BACKGROUND OF THE INVENTION

The present invention relates, in general, to interconnect structures for semiconductor devices and, more particularly, to quantum well semiconductor via structures for semiconductor devices.

As semiconductor device dimensions approach the sub-micron level, one of the limiting factors for further reduction in size is area required for device interconnections. One possible solution is multilevel metallization in which two or more interconnect layers are formed on top of a device, separated by an interlayer dielectric, and coupled by holes, or vias, which are filled with a via metallization. Even with multilayer metallization, though, the area required for vias limits further reduction in device size.

Small metal vias also result in current crowding and less reliable operation due to electromigration effects. Current crowding occurs at metal corners at the interface between the interconnect layer and the via metallization, resulting in higher current density at the corners than in the body of the via metallization. Current crowding effects significantly reduce the lifetime and reliability of the via metallization. These reliability problems are complicated in modern devices which require millions of metal interconnections.

Another problem with previous multilayer metallization processes was filling the via with the via metallization without creating voids so that a high quality electrical contact was formed. Conventional metal deposition methods such as evaporation, sputtering, and reactive ion sputtering have been used to fill vias. These metal deposition methods result in poor step coverage in small vias, which is aggravated as the aspect ratio, that is the ratio of height to width of the via, increased. Poor step coverage forces manufacturers to slope the via walls to step coverage and decrease the aspect ratio, but also increased the dimensions of the contact. What is needed is a truly compact, reliable interconnect method and structure that does not use conventional metal materials and processes.

SUMMARY OF THE INVENTION

Briefly stated, the advantages of the present invention are achieved by a semiconductor device having a vertical interconnect or via formed by a quantum well comprising a semiconductor material. A first semiconductor device having a current carrying region is formed in a first horizontal plane on a crystal substrate. A second semiconductor device having another current carrying region is formed in a second horizontal plane. Each of the current carrying regions has a first quantized energy level that is substantially equal. A semiconductor quantum well via couples the current carrying region of the first semiconductor device to the current carrying region of the second device, wherein the semiconductor via has a first quantized energy level capable of alignment with the quantized energy levels of the current carrying regions of the first and second semiconductor devices.

DETAILED DESCRIPTION OF THE DRAWINGS

Conventional metal interconnect technology requires that metal layers be deposited at a late stage of processing to prevent damage to the metal layer during high temperature processing usually associated with semiconductor manufacturing. Because of this, all of the device interconnections must be made at the upper surface of the device and each electrode of each device must couple to one or more metal interconnect networks formed on the surface. In accordance with the present invention, a densely populated integrated circuit is provided by interconnecting devices in three dimensions using less area and allowing more complex interconnection than required by conventional metal interconnect technology.

Figure 1:
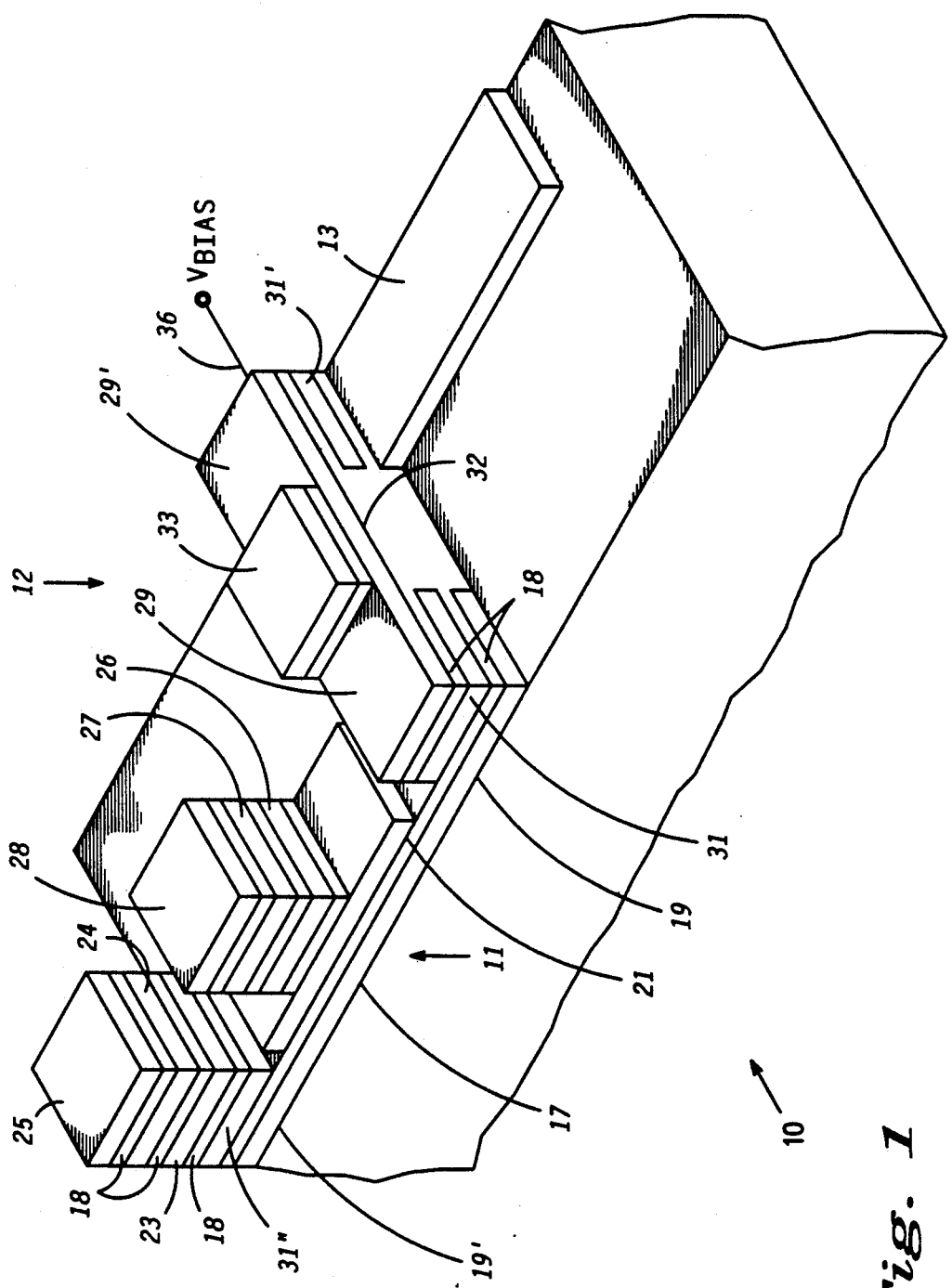
FIG. 1 illustrates a cross sectional perspective view of a semiconductor device having a vertical quantum well via in accordance with the present invention.

Common semiconductor devices useful in the practice of the present invention include metal oxide semiconductor and bipolar transistors, resistors, capacitors, and the like. The cross-sectional perspective view shown in FIG. 1 illustrates a simple device structure having active devices 11 and 12, and a passive device 13. Devices 11, 12 and 13 are formed on a crystal substrate 10 which comprises, for example, semi-insulating gallium arsenide (GaAs). It should be understood that the upper surface of substrate 10 usually includes an epitaxially grown buffer layer to improve crystal perfection and compatibility with subsequent epitaxial processing. For ease of illustration and understanding, however, a buffer layer is not separately shown in FIG. 1.

The device shown in FIG. 1 is provided by forming a layer of a first material composition on the upper surface of substrate 10. This first semiconductor layer is patterned to provide a first active device region 17 and current carrying portions 19 and 19'. Other devices, such as device 13, can be formed in the same horizontal plane as first device 11 having the same material composition as device 11. Usually, devices 11 and 13 will have similar thicknesses and will be isolated from each other during the patterning step or by isolation regions formed by diffusion or oxygen implantation. In FIG. 1, active device region 17 is a channel of a field effect transistor. Current carrying portions 19 and 19' are source/drain regions which are coupled to active device region 17. Device 13 is illustrated as a resistor or a plate of a capacitor.

The material composition and thickness of current carrying portions 19, 19' are selected to create a quantum well having a quantized energy state $E_{Oa}$ using techniques well known in the semiconductor art. The preferred value of $E_{Oa}$ is described in greater detail with reference to FIG. 2 and FIG. 3. In a preferred embodiment, current carrying portions 19 and 19', as well as active device region 17 comprise gallium antimonide (GaSb) or indium arsenide (InAs) and are in the range of five to twenty-five nanometers thick.

A first barrier layer comprising a wide bandgap material 18 is formed covering the patterned first semiconductor layer. All of the barrier layers 18 shown in FIG. 1 are substantially the same, and comprise a material such as aluminum antimonide (AlSb) or aluminum gallium antimonide (AlGaSb) and are about three to ten nanometers thick. Thickness of barrier layers 18 is selected to allow significant tunneling between adjacent quantum wells under predetermined bias conditions.

Barrier layer 18 is covered by a second semiconductor layer comprising a second material composition. For ease of illustration, regions of the first material composition are darkly shaded, regions of the second material composition are lightly shaded, and regions of barrier material 18 are not shaded. The second material composition preferably comprises gallium antimonide or indium arsenide, but should be different from the first material composition. In other words, if GaSb is used for the first material composition, InAs should be used for the second material composition. Likewise, if the first material composition is InAs, the second material composition should be GaSb.

This second semiconductor layer is patterned to provide semiconductor vias 31, 31' and 31" aligned to current carrying portions 19 and 19' and device 13. The semiconductor vias 31, 31' and 31" each have a quantized energy state $E_{Ob}$ determined by material composition and thickness as is well known. Conveniently, other device elements such as gate electrode 21 can be formed simultaneously with the patterning step that provides semiconductor quantum well vias 31, 31' and 31".

Another barrier layer comprising the wide bandgap material 18 covers the patterned second semiconductor layer. A third semiconductor layer comprising the first material composition is formed on the barrier layer 18 and patterned to provide active device 12. Active device 12 is illustrated as a field effect transistor having an active device region 32 and current carrying portions 29 and 29' coupled to the active device region 32. Current carrying portions 29, 29' should have the quantized energy state $E_{Oa}$.

Many layers of devices can be stacked vertically by simple repetition of the basic processes described above. Alternating layers of first and second material composition are laminated onto the structure, each layer patterned to form active devices or device elements such as gate electrode 33. Each layer of the first or second material composition is separated from adjacent layers by a layer of wide bandgap material 18. In addition to forming active devices, some of the layers will be used to make connection to the final surface of the integrated circuit. For example, in FIG. 1 layers 23 and 25, which comprise the first material composition, together with layer 24, which comprises the second material composition, are stacked vertically above semiconductor via 31" and themselves serve as semiconductor quantum well vias to coupled current carrying portion 19' with other devices or electrodes (not shown) which lie in a higher horizontal plane than devices 11 and 12. Similarly, layers 26, 27, and 28 serve as semiconductor quantum well vias to facilitate electrical connection to gate electrode 21 of device 11.

An important feature of the present invention is that $E_{Ob}$ is chosen to be alignable with $E_{Oa}$. By the term "alignable" it is meant either that $E_{Oa}$ and $E_{Ob}$ are the same, or that they can be made equal by application of an appropriate bias potential ($V_{BIAS}$) as suggested by bias electrode 36 schematically coupled to quantum well via 31'. Electrode 36 may also couple to an output of another device (not shown). This feature of the present invention is best understood with reference to the band diagrams shown in FIG. 2 and FIG. 3.

Figure 2:
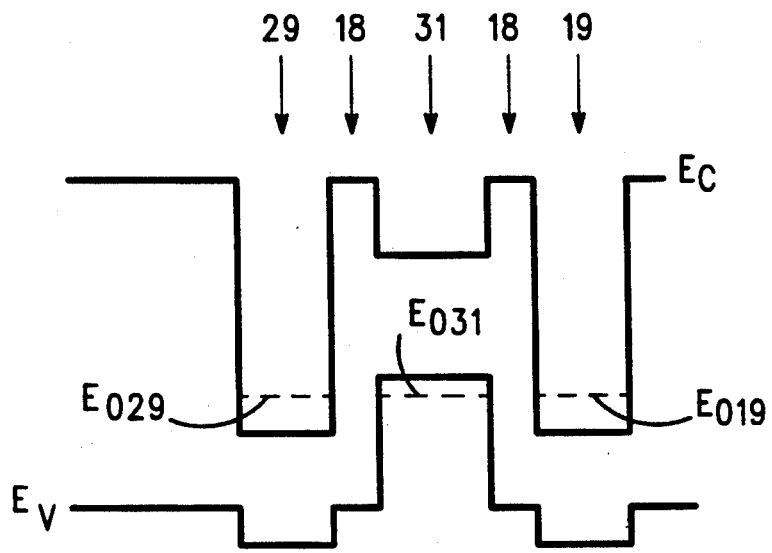
FIG. 2 illustrates a band diagram of a first portion of the structure shown in FIG. 1.

FIG. 2 illustrates a band diagram through a portion of the structure shown in FIG. 1 including current carrying region 29, semiconductor quantum well via 31, and current carrying region 19. This aspect of a device in accordance with the present invention shows a quantum well via 31 that is normally "on" or conductive. That is to say that semiconductor quantum well via 31 is conductive, and has a first quantized energy level $E_{O31}$ that is aligned with the first quantized energy levels $E_{O19}$ and $E_{O29}$ of current carrying regions 19 and 29 in the absence of applied bias potential.

In operation, charge carriers flow from current carrying region 19 of semiconductor device 12 (shown in FIG. 1), tunnel through barrier 18, pass through quantum well via 31 in first quantized energy state $E_{O31}$. Also, charge carriers tunnel through the remaining barrier material 18 and into $E_{O29}$ of current carrying region 29 of semiconductor device 12 (shown in FIG. 1). When $E_{O31}$ aligns with $E_{O19}$ and $E_{O29}$, electrons in the valence band of quantum well via 31 tunnel to current carrying regions 19 and 29, simultaneously leaving behind holes. In this manner quantum well via 31 conducts charge much like a conventional metal via, but without the disadvantages and process limitations associated with metal.

Figure 3:
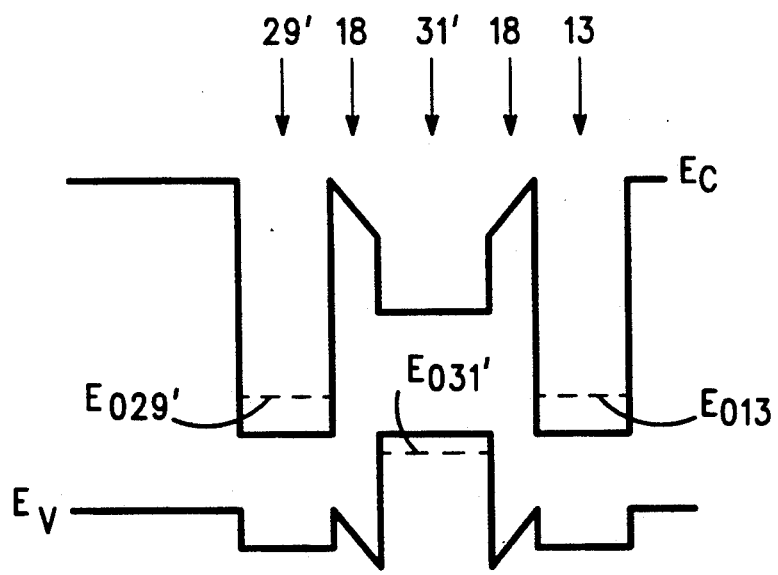
FIG. 3 illustrates a band diagram of a second portion of the structure shown in FIG. 1.

FIG. 3 illustrates a band diagram through a portion of the structure shown in FIG. 1 including current carrying region 29', semiconductor quantum well via 31', and third semiconductor device 13. This aspect of a device in accordance with the present invention shows a quantum well via 31' that can be controllably turned "on" or "off" by application of a bias voltage ($V_{BIAS}$) to a terminal 36 coupled to quantum well via 31'. That is to say that semiconductor quantum well via 31' is conductive, and has a first quantized energy level $E_{O31}$ that is aligned with the first quantized energy levels $E_{O13}$ and $E_{O29}$ of current carrying regions 19 and 13 only when a predetermined bias potential is applied to quantum well via 31'.

In operation, charge carriers flow from current carrying region 29' of semiconductor device 12 (shown in FIG. 1), tunnel through barrier 18, pass through quantum well via 31' in first quantized energy state $E_{O31'}$. Finally, charge carriers tunnel through the remaining barrier material 18 and into $E_{O13}$ of semiconductor device 13 (shown in FIG. 1). In this manner quantum well via 31' conducts charge like a metal via that can be controllably switched between conductive and nonconductive state, allowing a great deal of flexibility in the design of integrated circuitry.

By now it should be appreciated that a semiconductor device having vertical interconnections using semiconductor quantum well vias is provided. Using semiconductor materials for interconnections greatly reduces the number of metal interconnections required for complex integrated circuits, thus improving reliability. Moreover, the quantum well vias in accordance with the present invention allow truly three dimensional device arrangement, improving packing density and functionality of integrated circuits.

We claim:

1. A semiconductor device having a vertical quantum well via comprising:

a substrate having an upper surface;

a first semiconductor device formed on the upper surface in a first horizontal plane parallel to the upper surface, wherein the first semiconductor device includes a current carrying region that has a first quantized energy level;

a second semiconductor device formed in a second horizontal plane vertically spaced from the first horizontal plane, wherein the second semiconductor device includes a current carrying region that has a first quantized energy level substantially equal to that of the current carrying region of the first semiconductor device; and a semiconductor via electrically coupling the current carrying region of the first semiconductor device to the current carrying region of the second semiconductor device so as to provide current for operation of the first and second semiconductor devices, wherein the semiconductor via has a first quantized energy level capable of alignment with the quantized energy levels of the current carrying regions of the first and second semiconductor devices.

2. The semiconductor device having a vertical quantum well via of claim 1 further comprising: a first layer of wide bandgap barrier material separating the current carrying region of the first semiconductor device from the semiconductor via; and a second layer of wide bandgap barrier material separating the current carrying region of the second semiconductor device from the semiconductor via.

3. The semiconductor device having a vertical quantum well via of claim 1 wherein the current carrying regions of the first and second semiconductor devices comprise indium arsenide, and the semiconductor via comprises gallium antimonide.

4. The semiconductor device having a vertical quantum well via of claim 1 wherein the current carrying regions of the first and second semiconductor devices comprise gallium antimonide, and the semiconductor via comprises indium arsenide.

5. The semiconductor device having a vertical quantum well via of claim 2 wherein the barrier material comprises aluminum antimonide.

6. The semiconductor device having a vertical quantum well via of claim 2 wherein the barrier material comprises aluminum gallium antimonide.

7. The semiconductor device having a vertical quantum well via of claim 1 wherein the semiconductor via is coupled to an electrode for electrically coupling to an output of another device.

8. A semiconductor device having a vertical quantum well via comprising:

a substrate having an upper surface;

a first transistor formed on the upper surface in a first horizontal plane parallel to the upper surface, wherein the first transistor includes a first source/drain region, a second source/drain region and a channel region;

a second transistor formed in a second horizontal plane vertically spaced from the first horizontal plane, wherein the second transistor includes a first source/drain region, a second source/drain region, and a channel, wherein a first quantized energy level of the source/drain regions of the first transistor is substantially equal to a first quantized energy level of the source/drain regions of the second transistor; and a semiconductor via electrically coupling one source/drain region of the first transistor to one source/drain region of the second transistor so as to provide current for operation of the first and second transistors, wherein the semiconductor via has a first quantized energy level capable of alignment with the quantized energy levels of the source/drain regions of the first and second transistors.

* * * * *